United States Patent [19]

Zablotny et al.

[11] Patent Number: 5,087,396
[45] Date of Patent: Feb. 11, 1992

[54] METHOD OF FORMING HOLES IN UNFIRED CERAMIC LAYERS OF INTEGRATED CIRCUIT PACKAGES

[75] Inventors: Gordon O. Zablotny, San Diego; Robert D. Curtis, Encinitas; James William Horner, San Diego; Ronald Allen Norell, Carlsbad; all of Calif.

[73] Assignee: Unisys Corporation, Blue Bell, Pa.

[21] Appl. No.: 662,314

[22] Filed: Feb. 21, 1991

Related U.S. Application Data

[63] Continuation of Ser. No. 244,330, Sep. 15, 1988, abandoned.

[51] Int. Cl.$^5$ .............................................. B29C 37/02
[52] U.S. Cl. ................................ 264/25; 219/121.71; 264/61
[58] Field of Search ................ 264/25, 61; 219/121.71

[56] References Cited

U.S. PATENT DOCUMENTS 4,650,619 3/1987 Watanabe .............................. 264/64

OTHER PUBLICATIONS

Horizon for Laesers, Reprinted from Electronic Packaging & Production, Mar. 1971.

*Primary Examiner*—James Derrington
*Attorney, Agent, or Firm*—Charles J. Fassbender; Mark T. Starr

[57] ABSTRACT

Via holes in a thin planar layer of unfired ceramic which consists essentially of a mixture of an inorganic nonmetallic powder having a high melting temperature and a binder having a lower vaporizing temperature, are formed by the steps of: directing a laser beam, in a sequence, at certain locations on the layer where the via holes are to be formed; controlling the power density in the directed laser beam to a low level at which the binder vaporizes at each of the locations while the powder stays unsintered and unmelted; and removing from the directed laser beam during the above steps, both the vaporized binder and the unbound powder which remains where the binder vaporizes. Preferably, the vaporizing temperature of the binder and the melting temperature of the binder and the melting temperature of the powder are selected such that they differ by at least 200° C.; the power density of the laser is controlled to be between 5 kW/cm$^2$ and 75 kW/cm$^2$; and the removing step is performed by impinging a gas jet at each location where the laser beam is directed and simultaneously vacuuming the location.

12 Claims, 4 Drawing Sheets

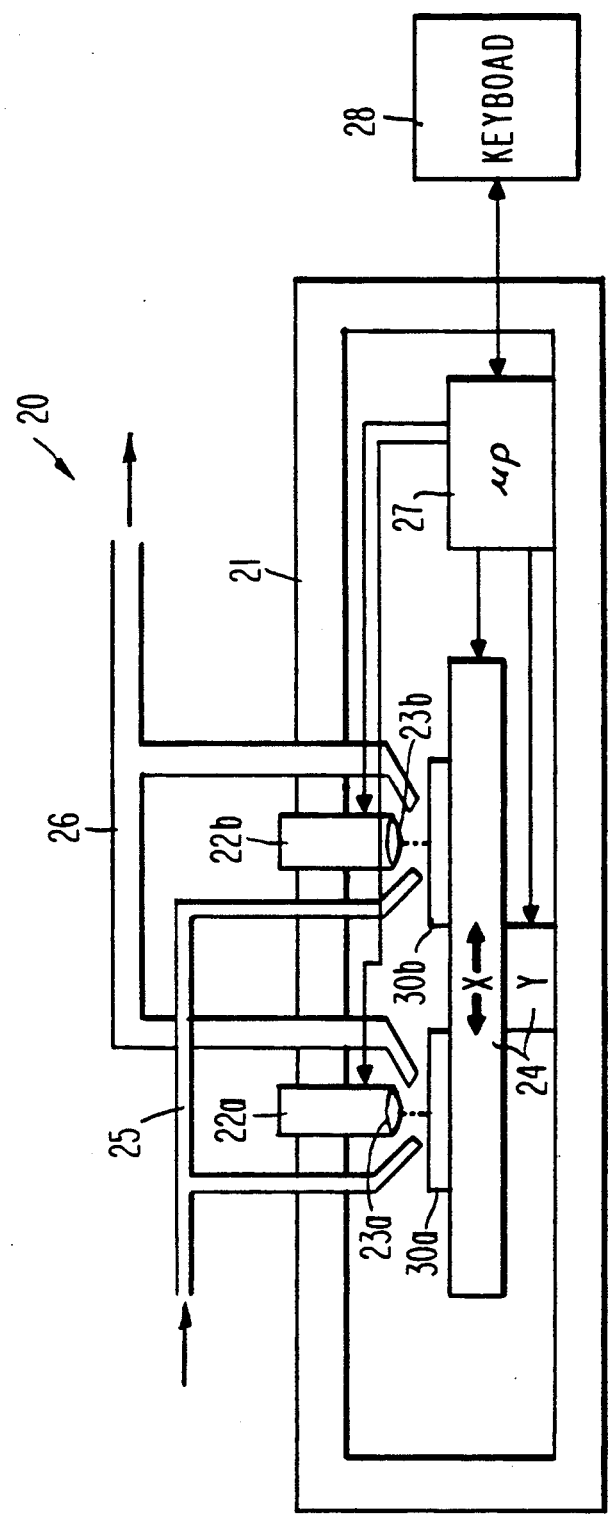

METHOD OF FORMING HOLES IN UNFIRED CERAMIC LAYERS OF INTEGRATED CIRCUIT PACKAGES

This is a continuation of co-pending application Ser. No. 244,330 filed on Sept. 15, 1988, now abandoned.

BACKGROUND OF THE INVENTION

This invention relates to multilayer ceramic integrated circuit packages; and more particularly, it relates to methods and apparatus for forming holes in the unfired layers of such packages during their fabrication.

Integrated circuits are conventionally fabricated on thin flat semiconductor chips which are about five to fifteen millimeters across and about one millimeter thick. These chips are quite fragile; and consequently, they are usually encapsulated in a package to protect them from damage. Such an integrated circuit package also contains conductors which contact microscopic bonding pads on the chip and thereby provide a means for sending electrical signals to and receiving electrical signals from the chip.

A conventional process for making multilayer ceramic integrated circuit packages is illustrated in FIGS. 1A, 1B, and 1C. Initially, a sheet of unfired ceramic is cut with a punch to form a part 10 of FIG. 1A. Part 10 is rectangular in shape, and it has several tooling holes 11. Thereafter, the part 10 is aligned under a second punch by means of the tooling holes 11; and it punches many small via holes 12 in the part. This results in part 10' as is shown in FIG. 1B. Subsequently, the part 10' is positioned under a third punch by means of the tooling holes 11, and it punches a central aperture 13 in the part. This results in part 10'', as is shown in FIG. 1C.

Part 10'' is just one layer of a complete integrated circuit package; and typically, the package will have from four to sixteen layers. All of the steps of FIGS. 1A-1C are repeated for each of the upper layers of the package, and the steps of FIGS. 1A-1B are repeated for the lower layers.

After the parts 10' and 10'' are formed, the via holes 12 are filled with a conductive ink. Next, patterned conductive traces are screened on them. Then, the parts are arranged in a stack in which the tooling holes 11 are utilized to align the various layers. This stack is then compressed and "fired" at a temperature of about 80% of the melting temperature of the powder in the layers, which causes the powder to sinter and agglomerate. Then, to complete the package, an integrated circuit chip is placed in the aperture 13; wire bonds are made between the chip and the conductive traces around the perimeter of aperture 13; and a lid is sealed over the aperture.

This process has been used in the prior art to make millions of integrated circuit packages. However, the process does have several limitations which are very serious for certain types of packages. In particular, as the diameter of the via holes 12 becomes smaller and smaller, the punches which form those holes become weak and break. Thus, as a practical matter for a high volume production operation, the punched via holes 12 have a minimum diameter of about 10 mils.

Also, as the total number of via holes 12 on a part 10' or 10'' increases, the corresponding punch becomes more difficult to make and thus more expensive. This added expense is multiplied by the number of layers in the package since each layer has a different via hole pattern and thus requires a different punch. Further, unfired ceramic is a very abrasive material, and thus the punches wear out. So in a production environment, the total number of via holes in any one punched part is limited to about 300.

Further, when the tooling holes 11 are used to position the parts 10' and 10'' during the punching operations of FIGS. 1B and 1C, those holes 11 become slightly stretched. These stretched holes will cause the parts to become misaligned when they are subsequently arranged in a stack. In turn, the misalignment can cause a short circuit or an open circuit between a filled via hole of one layer and a conductive trace on an adjacent layer. Such defects are not repairable, and so just one defect will cause the package to be scrapped.

Accordingly, a primary object of the invention is to provide an improved method of fabricating multilayer integrated circuit packages in which all of the above problems are overcome.

BRIEF SUMMARY OF THE INVENTION

In accordance with the invention, via holes in a thin planar layer of unfired ceramic—which consists essentially of a mixture of an inorganic nonmetallic powder having a high melting temperature and a binder having a lower vaporizing temperature—are formed by the steps of: directing a laser beam, in sequence, at certain locations on the layer where the via holes are to be formed; controlling the power density in the directed laser beam to a low level at which the binder vaporizes at each of the locations while the powder stays unsintered; and removing from the directed laser beam during the above steps, both the vaporized binder and the unbound powder which remains where the binder vaporizes. Preferably, the vaporizing temperature of the binder and the melting temperature of the powder are selected such that they differ by at least 200° C.; the power density of the laser is controlled to be between $5kW/cm^2$ and $75kW/cm^2$; and the removing step is performed by impinging a gas jet at each location where the laser beam is directed and simultaneously vacuuming the location. Further in accordance with the invention, a central aperture and tooling holes are formed in the unfired ceramic layer by moving it under the controlled low power density laser beam such that the beam traces the perimeter of those holes while simultaneously performing the removing step with the gas jet and vacuum.

BRIEF DESCRIPTION OF THE DRAWINGS

Various features and advantages of the invention are described herein in conjunction with the accompanying drawings wherein:

FIG. 2 illustrates a laser machine for drilling via holes, and cutting tooling holes and a central aperture, in an unfired layer of a ceramic integrated circuit package in accordance with the invention;

DETAILED DESCRIPTION OF THE INVENTION

Figure 1A:
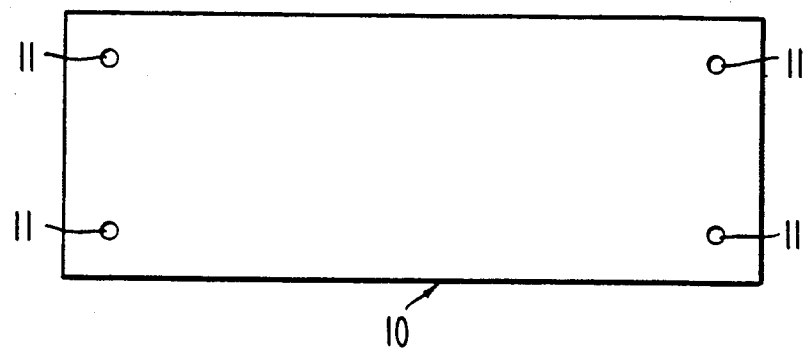
FIGS. 1A, 1B, and 1C illustrate a process for punching via holes, tooling holes, and a central aperture in an unfired layer of ceramic in accordance with a prior art method of fabricating integrated circuit packages.

Referring now to FIG. 2, a machine for drilling and cutting holes in the uncured ceramic layer of an integrated circuit package, in accordance with the invention, will be described in detail. This machine 20 includes a housing 21, a pair of lasers 22a and 22b, a pair of lenses 23a and 23b, an X-Y positioning table 24, an input air jet conduit 25, an output vacuum conduit 26, a microprocessor 27, and a keyboard 28. All of these components are mounted and interconnected as illustrated in FIG. 2.

In operation, separate thin flat pieces of unfired ceramic 30a and 30b are placed on table 24 beneath the lenses 23a and 23b respectively. Thereafter, a gas is forced under pressure through conduit 25 while a vacuum is simultaneously applied to conduit 26. As that is occurring, microprocessor 27 sends a sequence of control signals to the X-Y positioning table 24 and the lasers 22a and 22b. Those control signals are initiated by a "start" command that is entered by an operator via the keyboard 28.

In response to the control signals to the X-Y positioning table 24, the table sequentially moves the ceramic pieces 30a and 30b to all of the locations under the lenses 23a and 23b where the via holes are to be drilled. And at each of those locations, the control signals to the lasers 22a and 22b cause them to emit respective laser beams at a certain low power density onto the underlying ceramic pieces.

Each of the unfired ceramic pieces 30a and 30b consists essentially of a homogeneous composition of an inorganic nonmetallic powder having a high melting temperature and a binder having a substantially lower vaporizing temperature. Preferably, the difference between the vaporizing temperature of the binder and the melting temperature of the powder is at least 200° C. This difference enables the power density of the lasers 22a and 22b to be controlled to a low level which will vaporize the binder at the location in the unfired ceramic where the laser is directed while the powder remains unsintered.

When the binder is vaporized under the laser beam, the powder at that location becomes unbound. As that occurs, the unbound powder is immediately removed from the laser beams by an air jet and a vacuum which the conduits 25 and 26 respectively produce. This simultaneous action of locally vaporizing the binder under the low power laser beams and immediately removing the unbound powder in its solid state produces high quality via holes which are defect free.

Preferably, the power density of each laser beam is controlled to be between 5kW/cm$^2$ and 75kW/cm$^2$. Higher power densities will melt and/or vaporize the powder in the unfired ceramic composition, and that produces defects in the via holes. Also preferably, the time duration of the laser beam for each hole through the unfired ceramic layer of up to 30 mils thickness is between 2 and 8 milliseconds.

One specific example of a suitable powder in the unfired ceramic composition is 90% to 96% (by weight) aluminum oxide with the remainder being a mixture of silicon dioxide, calcium oxide, and magnesium oxide. Coloring agents such as chrome oxide, iron oxide, and molybdenum oxide can also be added as desired. Such a powder has a melting temperature of 1500° C.–2000° C.

Another example of a suitable powder is 45% to 55% aluminum oxide with the remainder being boron oxide and silicon dioxide. This powder can also contain any one of a number of glass-modifying materials such as zinc oxide or aluminum oxide-magnesium oxide-silicon dioxide compositions known as forsterite or cordierite. Such a powder has a melting temperature in the range of 900° C.– 1000° C.

Still another suitable powder is >99% aluminum oxide, aluminum nitride, silicon carbide, and mullite. These powders have melting temperatures of about 1500° C. to 2200° C.

Some specific examples of suitable binders are the acrylic resin binders #5200 from Du Pont and B7 from Rohm & Haas. They vaporize at 300° C.–500° C.

Figure 3:
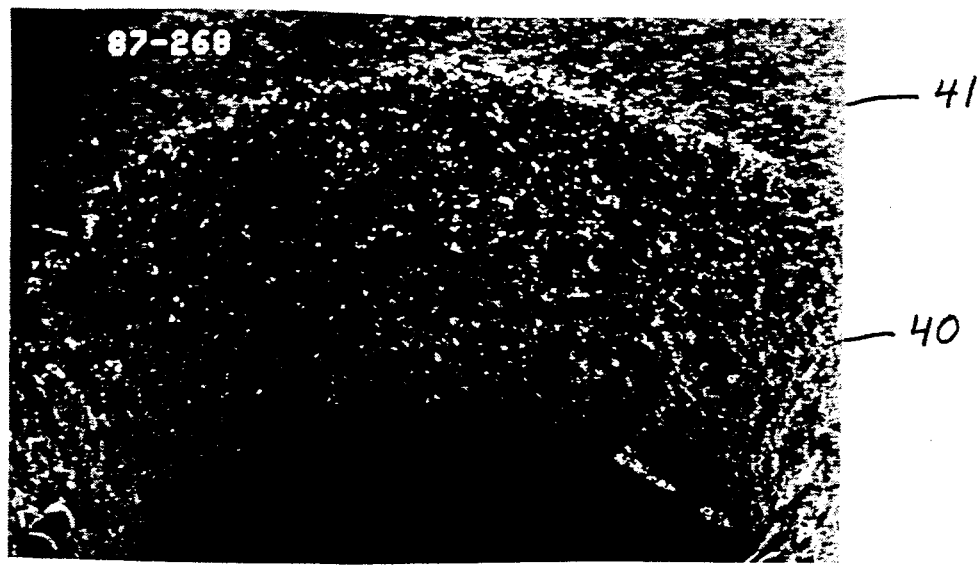
FIG. 3 is a microphotograph of a via hole in an unfired ceramic layer which is drilled in accordance with the invention by the machine of FIG. 2.

FIG. 3 is a microphotograph of a via hole which was drilled in a piece of unfired ceramic by the abovedescribed process. In this particular unfired ceramic composition, the powder had a melting temperature of about 900° C. and the binder had a vaporizing temperature of about 400° C. Also, this particular hole is 8 mils in diameter and 4 mils deep. It was formed by an 8-mil diameter CO$_2$ laser beam whose power was controlled to 3.8–4.6 watts, or about 13kW/cm$^2$.

One particular structural feature of the FIG. 3 via hole is that its ceramic sidewalls have not been melted by the laser beam. This is evident from inspection of FIG. 3 which shows that the texture of the via hole sidewalls 40 has uniformly small grains.

Another feature of the FIG. 3 via hole is that it has a clean and sharply defined perimeter. This is evident from inspection of the top surface 41 in FIG. 3 which shows that no contamination or vapor residue is deposited around the hole perimeter.

Figure 4:
FIG. 4 is a microphotograph of the edge of a cut in an unfired ceramic layer that is made by the machine of FIG. 2 in accordance with the invention.

Considering now FIG. 4, it shows the top surface of a cut that was made through a 20 mil thick layer of unfired ceramic by directing an 8 mil diameter CO$_2$ laser beam at the layer while it was moved by the X-Y positioning table 24. In this particular unfired ceramic composition, the powder had a melting temperature of about 1500° C., and the binder had a vaporizing temperature of about 500° C. During this cutting operation, the laser beam had a power density of about 67kW/cm$^2$; the unfired ceramic layer was moved at about one inch per second; and the air jet and vacuum from conduits 25 and 26 respectively were applied.

Inspection of FIG. 4 shows that the cut is defect free. In particular, there is no vapor residue or contamination built up along the edge 50 of the cut. Also, the texture of the cut has uniformly small grains, just like the via hole of FIG. 3.

Figure 5:
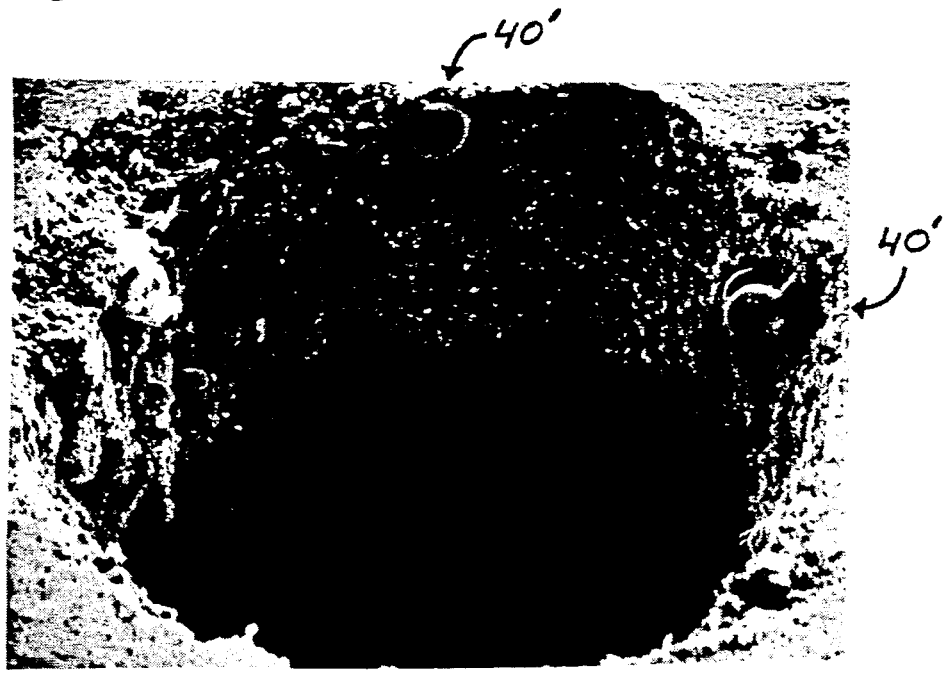
FIG. 5 is a microphotograph of a via hole in an unfired ceramic layer which is drilled by a laser incorrectly.

By comparison, FIG. 5 is a microphotograph of a via hole which was formed by an unsuitable modification to the above-described laser drilling process. That FIG. 5 via hole is of the same diameter and same depth as the FIG. 3 via hole, and it is made in the same type of unfired ceramic material. Also, it was made with a CO$_2$ laser while an air jet and a vacuum were applied to the location where the hole was being formed. However, the power density of the laser beam which formed the FIG. 5 hole was 130kW/cm$^2$. That increased power density caused some of the ceramic powders on the sidewall of the via hole to melt and/or vaporize, and then resolidify; and that produced the large beads or spheres of ceramic 40' on the sidewall.

Such firing of the via hole sidewalls renders the process unsuitable for use in making integrated circuit packages. That is because firing the ceramic causes it to shrink by about ten to twenty percent. But that shrinkage is not supposed to occur until the last steps of the manufacturing process in which several unfired ceramic layers whose via holes are filled with conductive ink are arranged in a stack and fired together. Firing ceramic after its holes are filled with ink allows both the ceramic and the conductive ink to shrink together. If the ceramic around the via hole is prefired and preshrunk, then the conductive ink will fall out of the via hole when it is subsequently fired and shrunk.

Figure 6:
FIG. 6 is a microphotograph of a cut in an unfired ceramic layer which also is made by a laser incorrectly.

Also for comparison purposes, FIG. 6 shows the top surface of a cut which was formed by an 8 mil diameter $CO_2$ laser on the same material as that used in FIG. 4. This laser had a power density of only 25kW/cm$^2$, but the air jet and vacuum were not applied during the cutting operation. Such removal of the air jet and vacuum causes a vapor residue 50' to be deposited around the perimeter of the cut as well as on the lenses 23a and 23b of the lasers. This residue around the cut is a contaminant which can cause delamination between one layer and another of an integrated circuit package, and between one layer and a conductive trace such as a bonding pad. Also, such a residue on the lenses of the lasers will alter the beam power density.

Utilizing the above-described process of FIG. 3, via holes can be made with diameters that are much smaller than that which is practical with a punch. This is achieved by using a lens 23a or 23b in the FIG. 2 machine which focuses the laser beam to the desired beam diameter. Further, adjustable via hole diameters can be achieved by mounting the lenses 23a and 23b on a micrometer which moves perpendicular to the X-Y positioning table 24.

Another feature of the process of FIG. 3 is that the total number of via holes that are formed in any one layer can easily exceed that which is practical with a punch. Thousands of holes in any pattern are formed simply by programming the microprocessor 26. Further, by storing that program in a read/write memory, the number of holes and their pattern can quickly and inexpensively be modified by simply modifying the program.

Figure 1B:
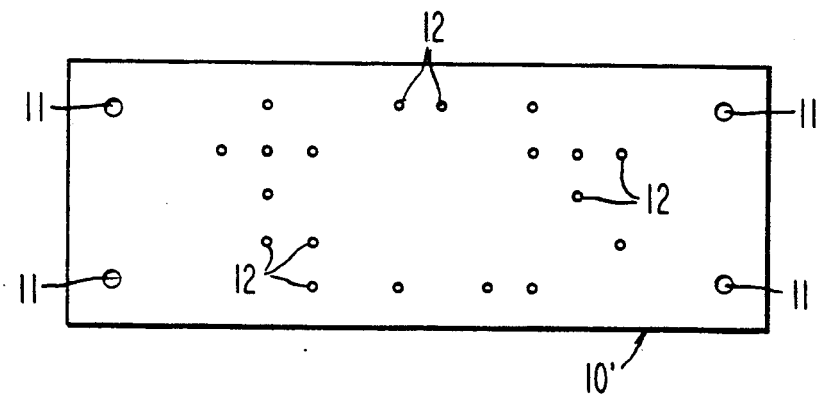
Figure 1C:
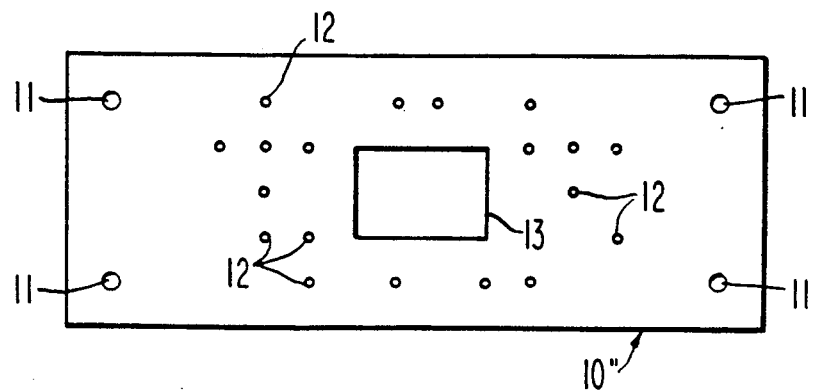

Still another advantage of the process of FIGS. 3 and 4 is that all of the via holes plus the tooling holes plus the central aperture are formed with a very close location tolerance. That occurs because the laser beam forms all of those holes in one operation. This eliminates the stretching and deformation of the tooling holes which occurs when the separate punching operations of FIGS. 1A, 1B, and 1C are used.

A preferred process for forming multilayer ceramic integrated circuit packages in accordance with the invention, as well as the machine for carrying out that process, has now been described in detail. In addition, however, many changes and modifications can be made to the those details without departing from the nature and spirit of the invention.

In particular, various types of focusing lenses can be used in the machine of FIG. 2. One specific example of a suitable focusing lens is a pair of bi-convex lenses which are spaced along an optic axis by a distance that is greater than the sum of the focal length of each lens. Such lenses, and others, are available from Melles Griot Corporation of Irvine, California.

Further, many different X-Y positioning tables can be used as table 24 in the machine of FIG. 2. One specific table that is suitable is a 12" X-Y slide table model 3342 from Anorad Corporation of Hauppauge, N.Y.

Similarly, many different microprocessors 27 can be used in the machine of FIG. 2 to generate the control signals to the X-Y positioning table and the lasers 22a-22b. Some specific examples are the Intel 80386, the Motorola 68030, the Zilog Z80000, the National memories. 22b. Some specific examples are the Intel 80386, the Motorola 68030, the Zilog Z80000, the National Semiconductor 21021, and their associated program memories.

Further, the number of lasers that are included in the machine of FIG. 2 can be increased or decreased. An inexpensive version of the FIG. 2 machine can have just one laser, whereas a high volume production machine can have a dozen lasers.

Also, the unfired ceramic layer which is operated on by the machine of FIG. 2 can be used as a component in various products besides an integrated circuit package. For example, the unfired ceramic layer can be part of a ceramic capacitor.

Accordingly, it is to be understood that the invention is not limited to the above details but is defined by the appended claims.

What is claimed is:

1. A method of making a layered electronic device including the steps of:
   forming a layer of said device with an unfired homogeneous composition that consists essentially of an inorganic nonmetallic powder having a high melting temperature and a binder having a lower vaporizing temperature;
   directing a laser beam at a location on said layer without protecting said layer around said location with a mask;
   heating said mixture at said location with said directed laser beam to a certain temperature which is above said vaporizing temperature of said binder and below said melting temperature of said powder;
   removing from said directed laser beam during the above steps, both the vaporized binder and the powder of said mixture as the powder becomes unbound by impinging a gas jet at said location where said laser beam is directed and simultaneously vacuuming said location whereby an opening at said location is formed; and,
   keeping the power density of said directed laser beam below 75kw per cm$^2$ throughout said heating step.

2. A method according to claim 1 wherein said vaporizing temperature of said binder and said melting temperature of said powder differ by at least 200° C.

3. A method according to claim 2 wherein said opening is formed with a width of less than ten mils.

4. A method according to claim 3 wherein said laser beam is directed at said location for less than ten milliseconds.

5. A method according to claim 4 wherein said directing, heating, removing, and keeping steps are performed at a plurality of locations in said layer which exceeds three-hundred.

6. A method according to claim 35 wherein said layer is from one mil to thirty mils thick.

7. A method according to claim 6 wherein said directing, heating, removing, and keeping steps are performed by multiple lasers which operate in parallel on respective layers.

8. A method according to claim 1 wherein said laser beam is directed at said location for less than ten milliseconds.

9. A method according to claim 1 wherein said directing, heating, removing, and keeping steps are performed at a plurality of locations on said layer which exceeds three-hundred.

10. A method according to claim 1 wherein said opening is formed with a width of less than ten mils.

11. A method according to claim 1 wherein said layer is from one mil to thirty mils thick.

12. A method according to claim 1 wherein said directing, heating, removing, and keeping steps are performed by multiple lasers which operate in parallel on respective layers.

* * * * *